(12) United States Patent
Kim et al.

(10) Patent No.: US 10,829,690 B2
(45) Date of Patent: Nov. 10, 2020

(54) SLURRY COMPOSITION FOR CHEMICAL MECHANICAL POLISHING, METHOD OF PREPARING THE SAME, AND METHOD OF FABRICATING SEMICONDUCTOR DEVICE BY USING THE SAME

(71) Applicant: Samsung Electronics Co., Ltd., Suwon-si (KR)

(72) Inventors: Bo-yun Kim, Hwaseong-si (KR); Kenji Takai, Hwaseong-si (KR); Do-yoon Kim, Hwaseong-si (KR); Sang-kyun Kim, Hwaseong-si (KR); Bo-un Yoon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/502,164

(22) Filed: Jul. 3, 2019

(65) Prior Publication Data
US 2020/0071613 A1     Mar. 5, 2020

(30) Foreign Application Priority Data

Aug. 30, 2018   (KR) .................. 10-2018-0103030

(51) Int. Cl.
*C09K 13/00*        (2006.01)
*C09G 1/06*         (2006.01)
(Continued)

(52) U.S. Cl.
CPC ............ *C09K 13/00* (2013.01); *C09G 1/06* (2013.01); *H01L 21/28088* (2013.01);
(Continued)

(58) Field of Classification Search
CPC . C09G 1/02; H01L 21/3212; H01L 21/30625; H01L 21/32115;
(Continued)

(56) References Cited

U.S. PATENT DOCUMENTS 6,872,681 B2    3/2005 Niu et al.
7,300,958 B2    11/2007 Kataoka et al.
(Continued)

FOREIGN PATENT DOCUMENTS

CN       1312031 A       4/2007
JP    2000042574 A       2/2000
(Continued)

OTHER PUBLICATIONS

Y. Takaya, H. Kishida, T. Hayashi, M. Michihata, and K. Kokubo, "Chemical mechanical polishing of patterned copper wafer surface using water-soluble fullerenol slurry," CIRP Annals—Manufacturing Technology 60 (2011) pp. 567-570 (4 pages).
(Continued)

*Primary Examiner* — Binh X Tran
(74) *Attorney, Agent, or Firm* — Muir Patent Law, PLLC

(57) ABSTRACT

Disclosed is a slurry composition for chemical mechanical polishing (CMP) includes, as polishing particles, a complex compound of both fullerenol and alkylammonium hydroxide. The slurry composition, which exhibits excellent polishing properties, may be prepared at low cost in large quantities. Also disclosed is a method of preparing the slurry composition comprising obtaining a mixture of a fullerenol complex compound and unreacted hydrogen peroxide by reacting alkylammonium hydroxide, hydrogen peroxide, and fullerene, removing the unreacted hydrogen peroxide by adding hydrogen peroxide decomposition catalyst particles to the mixture, separating the hydrogen peroxide decomposition catalyst particles from the mixture by filtration, and adding a polishing additive to the mixture. Further disclosed is a method of fabricating a semiconductor device that includes providing a pattern defining a trench, forming a metal material film on the pattern to fill the trench, and
(Continued)

performing CMP of the metal material film using the slurry composition.

20 Claims, 15 Drawing Sheets

(51) Int. Cl.
    *H01L 21/321* (2006.01)
    *H01L 29/66* (2006.01)
    *H01L 21/28* (2006.01)

(52) U.S. Cl.
    CPC .... *H01L 21/28123* (2013.01); *H01L 21/3212* (2013.01); *H01L 29/66545* (2013.01); *H01L 29/66795* (2013.01)

(58) Field of Classification Search
    CPC . H01L 2224/11616; H01L 2224/03616; C09K 3/1463
    See application file for complete search history.

(56) References Cited

U.S. PATENT DOCUMENTS

| | | |
|---|---|---|
| 7,754,054 B2 | 7/2010 | Mitra et al. |
| 7,900,855 B2 | 3/2011 | Asahi et al. |
| 8,048,275 B2 | 11/2011 | Suehiro et al. |
| 8,987,526 B2 | 3/2015 | Kokubo et al. |
| 9,085,463 B2 | 7/2015 | Farrell et al. |
| 9,567,222 B2 | 2/2017 | Jung et al. |
| 2005/0076580 A1* | 4/2005 | Tamboli ............... C09G 1/02 51/307 |
| 2009/0130849 A1* | 5/2009 | Lee ..................... B24B 37/044 438/693 |
| 2011/0065944 A1 | 3/2011 | MacFarland |

FOREIGN PATENT DOCUMENTS

| | | | |
|---|---|---|---|
| JP | 2011200771 A | 10/2011 | |
| JP | 2012248594 A | 12/2012 | |
| JP | 2015218127 A | 12/2015 | |
| KR | 100596994 B1 | 7/2006 | |
| KR | 101580561 B1 | 12/2015 | |
| KR | 20160024465 A | 3/2016 | |
| WO | WO-2007020939 A1 * | 2/2007 | ............... C09G 1/02 |
| WO | 2007020939 A1 | 2/2009 | |

OTHER PUBLICATIONS

K. Kokubo, K. Matsubayashi, H. Tategaki, H. Takada, and T. Oshima, "Facile Synthesis of Highly Water-Soluble Fullerenes Over Half-Covered by Hydroxyl Groups," ACS Nano (2008), pp. 2327-333 (5 pages).

Y. Takaya, H. Tachika, T. Hayashi, K. Kokubo, K. Suzuki, "Performance of water-soluble fullerenol as novel functional molecular abrasive grain for polishing nanosurfaces," CIRP Annals—Manufacturing Technology 58 (2009), pp. 495-498 (4 pages).

* cited by examiner

US 10,829,690 B2

SLURRY COMPOSITION FOR CHEMICAL MECHANICAL POLISHING, METHOD OF PREPARING THE SAME, AND METHOD OF FABRICATING SEMICONDUCTOR DEVICE BY USING THE SAME

CROSS-REFERENCE TO RELATED APPLICATION

This application claims the benefit of priority under 35 U.S.C. § 119 to Korean Patent Application No. 10-2018-0103030, filed on Aug. 30, 2018, in the Korean Intellectual Property Office, the disclosure of which is incorporated herein in its entirety by reference.

BACKGROUND

The disclosure relates to a slurry composition for chemical mechanical polishing, a method of preparing the slurry composition, and a method of fabricating a semiconductor device by using the slurry composition, and more particularly, to a slurry composition for chemical mechanical polishing, which may be prepared at low cost in large quantities and exhibits improved polishing properties, a method of preparing the slurry composition, and a method of fabricating a semiconductor device by using the slurry composition.

Since a slurry composition for chemical mechanical polishing, in which fullerenol is used as polishing particles, has a relatively high material removal rate and exhibits a high degree of flatness due to low dishing and low defects, the slurry composition has attracted attention as a promising slurry composition in the future. However, since high cost and complicated and cumbersome processes are required for mass production of fullerenols, it is difficult to mass-produce fullerenols.

SUMMARY

The disclosed embodiments provide a slurry composition for chemical mechanical polishing, which may be prepared at low cost in large quantities and exhibits excellent polishing properties.

The disclosed embodiments also provide a method of preparing a slurry composition for chemical mechanical polishing, which may be prepared at low cost in large quantities and exhibits excellent polishing properties.

The disclosed embodiments also provide a method of fabricating a semiconductor device by using the slurry composition for chemical mechanical polishing, which has been set forth above.

According to an aspect of the disclosed embodiments, there is provided a slurry composition for chemical mechanical polishing (CMP), the slurry composition including polishing particles, the polishing particles comprising a complex compound of fullerenol and alkylammonium hydroxide.

According to another aspect of the disclosed embodiments, there is provided a slurry composition for CMP, the slurry composition including: about 0.1 parts by weight to about 10 parts by weight of first polishing particles, based on 100 parts by weight of an aqueous dispersant; and about 0.1 parts by weight to about 10 parts by weight of second polishing particles, based on 100 parts by weight of the aqueous dispersant, wherein the first polishing particles include a complex compound of fullerenol and alkylammonium hydroxide, and the second polishing particles include at least one selected from among silica, ceria, zirconia, alumina, titania, barium titania, germania, mangania, and magnesia.

According to yet another aspect of the disclosed embodiments, there is provided a method of preparing a slurry composition for CMP, the method including: obtaining a mixture of a fullerenol complex compound and unreacted hydrogen peroxide by reacting alkylammonium hydroxide, hydrogen peroxide, and fullerene; removing the unreacted hydrogen peroxide by adding hydrogen peroxide decomposition catalyst particles to the mixture; separating the hydrogen peroxide decomposition catalyst particles from the mixture by filtration; and adding a polishing additive to the mixture.

According to yet another aspect of the disclosed embodiments, there is provided a method of preparing a slurry composition for CMP, the method including: mixing and stirring a first phase and a second phase in the presence of alkylammonium hydroxide, the first phase including fullerene dispersed in an organic solvent, and the second phase including hydrogen peroxide; performing phase separation between the first phase and the second phase and then removing the first phase; removing unreacted hydrogen peroxide by adding, into the second phase, hydrogen peroxide decomposition catalyst particles having diameters of about 0.01 mm to about 5 mm; separating the hydrogen peroxide decomposition catalyst particles by filtering the second phase; and adding a polishing additive to a residual mixture remaining after the separation of the hydrogen peroxide decomposition catalyst particles.

According to yet another aspect of the disclosed embodiments, there is provided a method of fabricating a semiconductor device, the method including: providing a semiconductor pattern defining a trench; forming a metal material film on the semiconductor pattern to fill the trench; and performing CMP of the metal material film by using the slurry composition for CMP according to embodiments such that the metal material film is defined within the trench.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
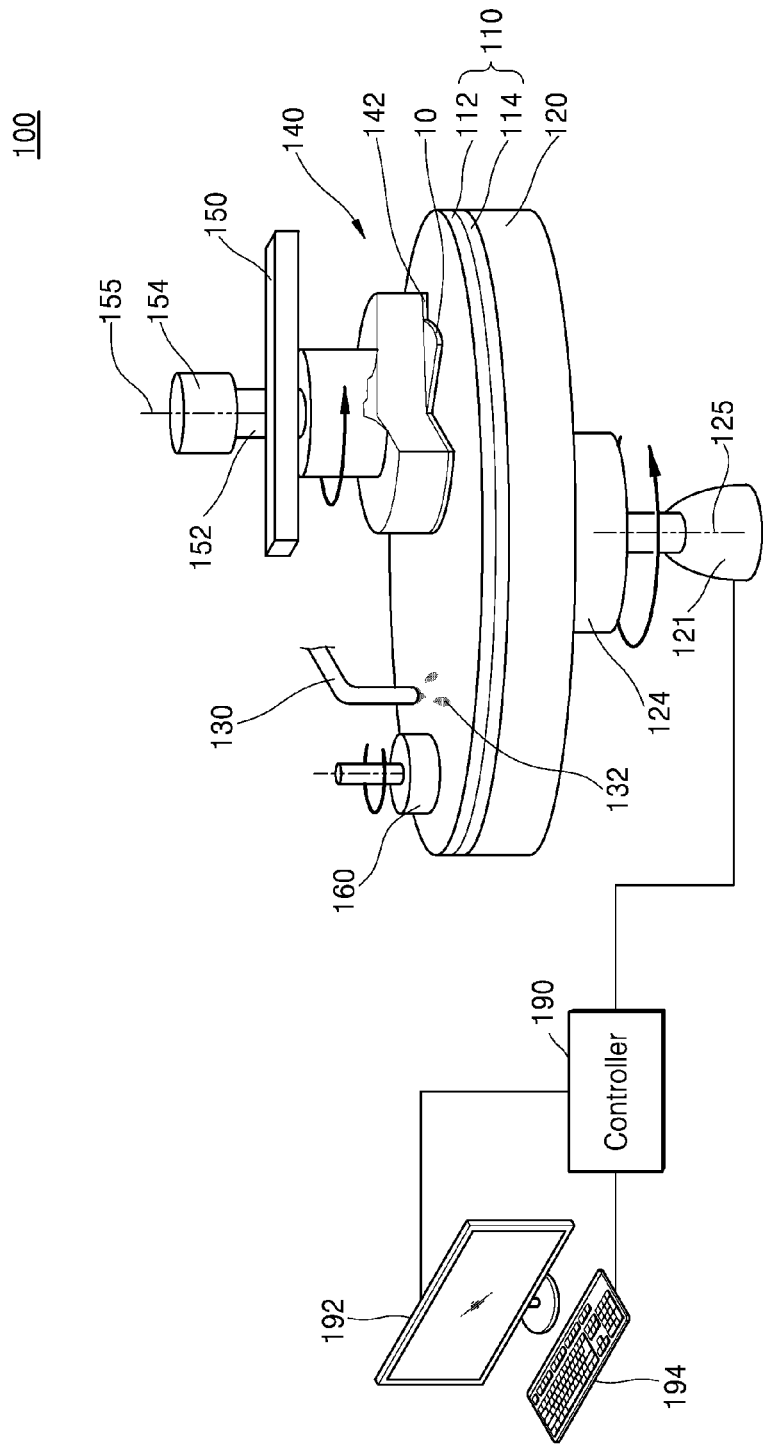
FIG. 1 is a conceptual perspective view of a polishing apparatus capable of performing chemical mechanical polishing, according to certain exemplary embodiments.

FIG. 1 is a conceptual perspective view of a polishing apparatus 100 capable of performing chemical mechanical polishing.

Referring to FIG. 1, the polishing apparatus 100 may include a platen 120 having a rotatable disc shape on which a polishing pad 110 is placed. The platen 120 may be rotated about a central axis 125 thereof. For example, a motor 121 may turn a driving shaft 124 to rotate the platen 120. The polishing pad 110 may be a polishing pad having at least two layers including an outer polishing layer 112 and a backing layer 114 that is more flexible than the outer polishing layer 112.

The polishing apparatus 100 may include a slurry port 130 configured to dispense a polishing agent 132, such as a slurry, toward the polishing pad 110. The polishing apparatus 100 may also include a polishing pad conditioner 160 configured to grind the polishing pad 110 such that the polishing pad 110 may be maintained in a consistent polishing state. The polishing pad conditioner 160 may rotate around a central axis thereof.

The polishing apparatus 100 may include at least one carrier head 140. The carrier head 140 may be configured to hold a substrate 10 against the polishing pad 110. The carrier head 140 may independently control polishing parameters, for example, pressures, associated with each substrate.

In particular, the carrier head 140 may include a retaining ring 142 to hold the substrate 10 under a flexible membrane, which is provided at the lower region of the carrier head 140. For example, the retaining ring 142 may surround the substrate 10, causing the substrate 10 to be retained against the flexible membrane. The carrier head 140 may include a plurality of pressurizable chambers, which may be defined by the flexible membrane and independently controlled. The plurality of pressurizable chambers may apply independently controllable pressures to associated zones of the flexible membrane and thus to associated zones of the substrate 10.

Since the carrier head 140 may hang from a support structure 150 (e.g., a carousel or a track) and be connected to a carrier head rotating motor 154 via a driving shaft 152, the carrier head 140 may be rotated about a central axis 155 thereof. Optionally, the carrier head 140 may be vibrated in a lateral direction, for example, on a slider on the support structure 150 or the track, or may be vibrated due to rotary vibration of the support structure 150. During operation, the platen 120 may be rotated about the central axis 125 thereof, and the carrier head 140 may be rotated about the central axis 155 thereof and the movement of the carrier head 140 may be translated across an uppermost surface of the polishing pad 110 in a lateral direction.

Although only one carrier head 140 is shown in FIG. 1, two or more carrier heads may be provided to maintain additional substrates such that a surface area of the polishing pad 110 may be efficiently used.

The polishing apparatus 100 may also include a control system configured to control rotation of the platen 120. The control system may include a controller 190 such as a general-use programmable digital computer, an output device 192 such as a monitor, and an input device 194 such as a keyboard.

Although the control system is shown in FIG. 1 as being connected only to the motor 121, the control system may also be connected to the carrier head 140 and control a pressure or rotation speed of the carrier head 140. Furthermore, the control system may be connected to the slurry port 130 and control the supply of slurry.

An embodiment provides a slurry composition for chemical mechanical polishing (CMP), which may be used by the polishing apparatus 100.

The slurry composition for CMP may include a complex compound of fullerenol and alkylammonium hydroxide.

Polishing Particles

The polishing particles may include a complex compound of both fullerenol represented by Chemical Formula 1 and alkylammonium hydroxide represented by Chemical Formula 2.

[Chemical Formula 1]

$C_q(OH)_p$ (where p is an arbitrary integer ranging from 10 to q, and q is 20, 24, 26, 28, 32, 36, 50, 60, 70, 72, 74, 76, 78, 80, 82, 84, 100, or 200).

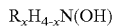
[Chemical Formula 2]

$R_xH_{4-x}N(OH)$ (where R is a C1 to C8 alkyl group, and x is an integer ranging from 1 to 4).

Hereinafter, each of the fullerenol and the alkylammonium hydroxide will be described in detail.

<Fullerenol>

The fullerenol may be a derivative of fullerene, in which a large number of hydroxyl groups are bonded to a surface of the fullerene.

Clusters including a large number of carbon atoms having closed atomic shell shapes are collectively referred to as fullerenes, and although buckminster fullerenes having 60 carbon atoms are representative fullerenes, there are fullerenes having various numbers of carbon atoms. For example, there are fullerenes having 20, 24, 26, 28, 32, 36, 50, 60, 70, 72, 74, 76, 78, 80, 82, 84, 100, or 200 carbon atoms. Generally, fullerenes are not dispersed well in an aqueous solvent such as water and are dispersed at relatively low solubility even in an organic solvent.

Fullerenols, in which a plurality of hydroxyl groups are bonded to fullerenes, may be dispersed relatively well in an aqueous solvent due to the hydroxyl groups having polarity and may also be monodispersed. In addition, when fullerenols are used as polishing particles of a slurry composition for CMP instead of oxide-based inorganic particles according to the related art, there are merits of a high material removal rate (MRR), low generation of defects such as scratches, and high degree of flatness of an obtained surface.

In some embodiments, the fullerenol of the fullerenol complex compound may have 60, 70, 72, 74, 76, 78, or 80 carbon atoms. In some embodiments, the fullerenol of the fullerenol complex compound may have about 30 to about 50 hydroxyl groups.

The fullerenol complex compound may be present in an amount of about 0.1 parts by weight to about 15 parts by weight, based on 100 parts by weight of a dispersant. If the amount of the fullerenol is too low, a polishing rate may be too low. If the amount of the fullerenol is too high, it may be difficult to control a polishing rate, and a polished surface of insufficient quality (for example, dishing) may be obtained.

In some embodiments, the fullerenol included in the fullerenol complex compound may be dispersion-treated such that a surface of fullerenol is positively or negatively charged.

For example, to make the surface of the fullerenol positively charged, the fullerenol may be treated with at least one selected from the group consisting of amino acids, polyalkylene glycols, glucosamine compound-bonded polysaccharides, and amine group-containing polymers. However, the embodiments are not limited thereto.

In some embodiments, to make the surface of the fullerenol negatively charged, for example, the fullerenol may be treated with at least one selected from the group consisting of carboxyl group-containing polymers and carboxyl group-containing organic acids. However, the embodiments are not limited thereto.

In some embodiments, the slurry composition for CMP may include two or more types of polishing particles and may include the fullerenol complex compound as one type of polishing particles. For example, the slurry composition for CMP may include about 0.1 parts by weight to about 10 parts by weight of the fullerenol complex compound as first polishing particles and about 0.1 parts by weight to about 10 parts by weight of oxide-based inorganic particles as second polishing particles, based on 100 parts by weight of an aqueous dispersant. In some embodiments, the second polishing particles may include at least one selected from among silica, ceria, zirconia, alumina, titania, barium titania, germania, mangania, and magnesia.

The slurry composition for CMP may further include a dispersant dispersing the polishing particles.

The dispersant may be any liquid capable of substantially uniformly dispersing the polishing particles without limitation. The dispersant may be an aqueous solvent or an organic solvent. More specifically, the dispersant may be an aqueous solvent such as water, deionized water, or ultrapure water. Optionally, the dispersant may be an organic solvent, such as a C1 to C15 aliphatic alcohol or the like, in particular, a polar organic solvent.

<Alkylammonium Hydroxide>

The alkylammonium hydroxide may have a structure represented by Chemical Formula 2, and the functional group, R, may be a C1 to C8 alkyl group.

More specifically, the alkyl group set forth above may be methyl, ethyl, n-propyl, isopropyl, n-butyl, isobutyl, sec-butyl, tert-butyl, n-pentyl, isopentyl, sec-pentyl, tert-pentyl, n-hexyl, n-heptyl, n-octyl, isooctyl, sec-octyl, tert-octyl group, or the like, without being limited thereto.

x, which is the number of substituents in the alkylammonium hydroxide, may be an integer of 1 to 4, in particular, 3 or 4. In some embodiments, when x is an integer of between 2 to 4, Rs may be identical to or different from each other.

The fullerenol complex compound described above may have a structure represented by Chemical Formula 3.

 [Chemical Formula 3]

(where p is an arbitrary integer ranging from 10 to q; q is 20, 24, 26, 28, 32, 36, 50, 60, 70, 72, 74, 76, 78, 80, 82, 84, 100, or 200; R is a C1 to C8 alkyl group; and x is an integer ranging from 1 to 4).

The slurry composition for CMP may include both of the fullerenol complex compound represented by Chemical Formula 3 and the fullerenol represented by Chemical Formula 1. The fullerenol, which is not a complex compound, may be fullerenol that has not formed a complex compound yet in conjunction with the alkylammonium hydroxide, and this will be described below in more detail.

The slurry composition for CMP according to embodiments may include at least one of a pH control agent, a polishing accelerator, an oxidizer, a dispersion stabilizer, a surfactant, a polishing inhibitor, a leveling agent, a corrosion inhibitor, and an amine compound. Hereinafter, each of these will be described.

pH Control Agent

The slurry composition for CMP may further include a pH control agent controlling a pH of the slurry composition. In some embodiments, the slurry composition for CMP may have a pH of about 1 to about 9. In some embodiments, the slurry composition for CMP may have a pH of about 2 to about 7. In some embodiments, the slurry composition for CMP may have a pH of about 4 to about 9.

An acid solution and an alkali solution may be appropriately used to control the pH of the slurry composition. In some embodiments, the pH control agent may include an acid solution such as sulfuric acid, phosphoric acid, hydrochloric acid, nitric acid, carboxylic acid, maleic acid, malonic acid, citric acid, oxalic acid, or tartaric acid, and/or an alkali solution such as calcium hydroxide, potassium hydroxide, ammonium hydroxide, sodium hydroxide, magnesium hydroxide, triethylamine, tetramethylammonium hydroxide, or ammonia, without being limited thereto. The pH control agent may be present, in the slurry composition for CMP, in an amount allowing the pH of the slurry composition for CMP to be within a desired range, and the amount of the pH control agent is not particularly limited.

Polishing Accelerator

Generally, a polishing accelerator widely used for CMP may include an anionic oligomer, an anionic polymer, a hydroxyl acid, or an amino acid. For example, the anionic oligomer may include at least one of citric acid, poly(acrylic acid), poly(methacrylic acid), copolymeric acids thereof, and salts thereof. In addition, the hydroxyl acid may include at least one of hydroxybenzoic acid, ascorbic acid, and salts thereof. Further, non-limiting examples of the amino acid may include nicotinic acid, serine, proline, arginine, asparagine, aspartic acid, cysteine, glutamine, glutamic acid, glycine, histidine, lysine, phenylalanine, tyrosine, valine, tryptophan, betaine, pyroglutamic acid, amino butyric acid, pyridine carboxylic acid, polyethyleneglycol amino ether acetatic acid, and isoleucine.

Additional examples of the polishing accelerator may include quinone-based compounds, such as 3-hydroxy-4-methyl-phenol anion, 3-hydroxy-4-hydroxymethyl-phenol anion, 4-methyl-benzene-1,3-diol, kojic acid, maltol propionate, and maltol isobutyrate. Non-limiting examples of the quinone-based compounds may include at least one selected from the group consisting of: dienones, diols, and dienol anions, which include alkylbenzene diols and hydroxyl and alkyl groups; dienones, diols, and dienol anions, in which phenol anions and alkyl groups are linked to oxo groups; and dienone, diol, and dienol anions, which include hydroxyalkyl groups and benzene rings.

Specifically, non-limiting examples of the quinone-based compounds may further include at least one selected from the group consisting of 4-alkyl-benzene-1,3-diol, hydroxy-4-alkyl-cyclohexa-2,5-dienone, 6-alkyl-3-oxo-cyclohexa-1,4-dienol anion, 3-hydroxy-6-alkyl-cyclohexa-2,4-dienone, 4-alkyl-3-oxo-cyclohexa-1,5-dienol anion, 3-hydroxy-4-alkyl-phenol anion, 5-hydroxy-2-alkyl-phenol anion, 3-hydroxy-4-alkyl-phenol anion, 5-hydroxy-2-hydroxyalkyl-phenol anion, 3-hydroxy-4-hydroxyalkyl-phenol anion, 3-hydroxy-4-hydroxyalkyl-cyclohexa-2,5-dienone, 6-hydroxyalkyl-3-oxo-cyclohexa-1,4-dienol anion, 3-hydroxy-6-hydroxyalkyl-cyclohexa-2,4-dienone, 4-hydroxyalkyl-3-oxo-cyclohexa-1,5-dienol anion, and 4-hydroxyalkyl-benzene-1,3-diol.

Other additional examples of the polishing accelerator may include ammonium hydrogen phosphate, ammonium dihydrogen phosphate, bis(2-ethylhexyl)phosphate, 2-aminoethyl dihydrogen phosphate, 4-chlorobenzenediazonium hexafluorophosphate, nitrobenzenediazonium hexafluorophosphate, ammonium hexafluorophosphate, bis (2,4-dichlorophenyl) chlorophosphate, bis(2-ethylhexyl) hydrogenphosphate, bis(2-ethylhexyl)phosphite, calcium fluorophosphate, diethyl chlorophosphate, diethyl chlorothiophosphate, potassium hexafluorophosphate, pyrophosphoric acid, tetrabutylammonium hexafluorophosphate, and tetraethylammonium hexafluorophosphate.

Oxidizer

Generally, the slurry composition for CMP, which is used to polish a metal material film, may include an oxidizer. Non-limiting examples of the oxidizer may include organic peroxides such as peracetic acid, perbenzoic acid, and tert-butyl hydroperoxide; permanganic acid compounds such as potassium permanganate; dichromic acid compounds such as potassium dichromate; halogen acid compounds such as potassium iodate; nitric acid compounds such as nitric acid and iron nitrate; perhalogen acid compounds such as perchloric acid; persulfates such as sodium persulfate, potassium persulfate, and ammonium persulfate; percarbonates such as sodium percarbonate and potassium percarbonate; carbamide peroxide; and heteropoly acids.

Dispersion Stabilizer

The slurry composition for CMP may further include a dispersion stabilizer to secure dispersion stabilization of the polishing particles. The dispersion stabilizer may include a nonionic polymer or a cationic organic compound. For example, the dispersion stabilizer may include at least one selected from the group consisting of ethylene oxide, ethylene glycol, glycol distearate, glycol monostearate, glycol polymerate, glycol ethers, alkylamine-containing alcohols, polymerate ether-containing compounds, vinyl pyrrolidone, celluloses, and ethoxylate-based compounds. Specifically, the dispersion stabilizer may include at least one selected from the group consisting of diethylene glycol hexadecyl ether, decaethylene glycol hexadecyl ether, diethylene glycol octadecyl ether, eicosaethylene glycol octadecyl ether, diethylene glycol oleyl ether, decaethylene glycol oleyl ether, decaethylene glycol octadecyl ether, nonylphenol polyethylene glycol ether, ethylenediamine tetrakis(ethoxylate-block-propoxylate) tetrol, ethylenediamine tetrakis (propoxylate-block-ethoxylate) tetrol, polyethylene-block-poly(ethylene glycol), polyoxyethylene isooctylphenyl ether, polyoxyethylene octylphenyl ether, polyoxyethylene tridecyl ether, polyoxyethylene sorbitan tetraoleate, polyoxyethylene sorbitol hexaoleate, polyethylene glycol sorbitan monolaurate, polyoxyethylene sorbitan monolaurate, sorbitan monopalmitate, FS-300 nonionic fluorosurfactant, FSN nonionic fluorosurfactant, FSO nonionic ethoxylated fluorosurfactant, vinyl pyrrolidone, 2,4,7,9-tetramethyl-5-decyne-4,7-diol ethoxylate, 8-methyl-1-nonanol propoxylate-block-ethoxylate, allyl alcohol 1,2-butoxylate-block-ethoxylate, polyoxyethylene branched nonylcyclohexyl ether, and polyoxyethylene isooctylcyclohexyl ether. For example, the dispersion stabilizer may be present in an amount of about 0.1% by weight (wt %) to about 1 wt % in the slurry composition for CMP.

Surfactant

The slurry composition for CMP may further include a surfactant as needed. The surfactant may include any one of a nonionic surfactant, a cationic surfactant, an anionic surfactant, and an amphoteric surfactant.

Examples of the nonionic surfactant may include polyoxyethylene alkyl ethers such as polyoxyethylene lauryl ether and polyoxyethylene stearyl ether; polyoxyethylene alkylphenyl ethers such as polyoxyethylene octylphenyl ether and polyoxyethylene nonylphenyl ether; sorbitan higher fatty acid esters such as sorbitan monolaurate, sorbitan monostearate, and sorbitan trioleate; polyoxyethylene sorbitan higher fatty acid esters such as polyoxyethylene sorbitan monolaurate; polyoxyethylene higher fatty acid esters such as polyoxyethylene monolaurate and polyoxyethylene monostearate; glycerine higher fatty acid esters such as oleic acid monoglyceride and stearic acid monoglyceride; polyoxyalkylenes such as polyoxyethylene, polyoxypropylene, and polyoxybutylene; and block copolymers thereof.

Examples of the cationic surfactant may include alkyl trimethyl ammonium chloride, dialkyl dimethyl ammonium chloride, benzalkonium chloride, alkyl dimethyl ammonium ethosulfate, and the like.

Examples of the anionic surfactant may include carboxylic acid salts such as sodium laurate, sodium oleate, N-acyl-N-methylglycine sodium salt, and sodium polyoxyethylene lauryl ether carboxylate; sulfonic acid salts such as sodium dodecylbenzene sulfonate, dialkyl sulfosuccinic acid ester salts, and sodium dimethyl-5-sulfoisophthalate; sulfuric acid ester salts such as sodium lauryl sulfate (SLS), sodium polyoxyethylene lauryl ether sulfate, and sodium polyoxyethylene nonylphenyl ether sulfate; and phosphoric acid ester salts such as sodium polyoxyethylene lauryl phosphate and sodium polyoxyethylene nonylphenyl ether phosphate.

Examples of the amphoteric surfactant may include carboxybetaine surfactants, aminocarboxylic acid salts, imidazolinium betaine, lecithin, and alkylamine oxides.

The surfactant may be present in an amount of about 0.001 wt % to about 0.5 wt % in the slurry composition for CMP.

Polishing Inhibitor

The slurry composition for CMP may further include a polishing inhibitor as needed.

Non-limiting examples of the polishing inhibitor may include nitrogen-containing compounds, for example, amines, and nitrogen-containing heterocyclic compounds having low molecular weights, for example, benzotriazole, 1,2,3-triazole, and 1,2,4-triazole.

The polishing inhibitor may be present in an amount of about 0.1 wt % to about 1 wt % in the slurry composition for CMP.

Leveling Agent

The slurry composition for CMP may further include a leveling agent reducing unevenness of a surface to be polished, as needed.

Non-limiting examples of the leveling agent may include ammonium chloride, ammonium lauryl sulfate, polyethylene glycol, triethanolamine polyoxyethylene alkyl ether sulfate, polyvinylpyrrolidone, polyacrolein, and the like.

The leveling agent may be present in an amount of about 0.1 wt % to about 1 wt % in the slurry composition for CMP.

Corrosion Inhibitor

The slurry composition for CMP may further include a corrosion inhibitor protecting a surface to be polished from corrosion, as needed.

Non-limiting examples of the corrosion inhibitor may include triazole and derivatives thereof, and benzotriazole and derivatives thereof. The triazole derivatives may include amino-substituted triazole compounds and diamino-substituted triazole compounds, without being limited thereto.

The corrosion inhibitor may be present in an amount of about 0.001 wt % to about 0.15 wt % in the slurry composition for CMP. In some embodiments, the corrosion inhibitor may be present in an amount of about 0.0025 wt % to about 0.1 wt % or about 0.005 wt % to about 0.05 wt %.

Amine Compound

The amine compound may be a C1 to C20 compound having two or more amine groups in one molecule. In some embodiments, the amine compound may include diamines, triamines, tetramines, pentamines, hexamines, heptamines, or the like.

For example, the amine compound may include at least one selected from the group consisting of spermine, methanediamine, ethane-1,2-diamine, propane-1,3-diamine, butane-1,4-diamine, pentane-1,5-diamine, hexane-1,6-diamine, heptane-1,7-diamine, octane-1,8-diamine, diethylenetriamine, dipropylenetriamine, triethylenetetramine (TETA), tripropylenetetramine, tetraethylenepentamine (TEPA), pentaethylenehexamine (PEHA), hexaethyleneheptamine, bis(hexamethylene)triamine, N-(3-aminopropyl)ethylenediamine, N,N'-bis(3-aminopropyl)ethylenediamine, N,N'-bis(2-aminoethyl)-1,3-propanediamine, N,N,N'-tris(3-aminopropyl)ethylenediamine, N-3-aminopropyl-1,3-diaminopropane, N,N'-bis(3-aminopropyl)-1,3-diaminopropane, N,N,N'-tris(3-aminopropyl)-1,3-diaminopropane, bis-(3-aminopropyl)amine, N,N,N'N'-tetrakis(2-hydroxypropyl)ethylenediamine, N,N,N',N'-tetramethylpropanediamine, di-t-butylethylenediamine, 3,3'-iminobis(propylamine), N-methyl-3,3'-iminobis(propylamine), N,N'-bis(3-aminopropyl)-1,3-propylenediamine, N,N'-bis(3-aminopropyl)-1,4-butylenediamine, N,N'-bis(4-aminobutyl)-1,4-butanediamine, N,N'-bis(2-aminoethyl)-1,4-butanediamine, N,N'-bis(2-aminoethyl)ethylenediamine, bis(3-aminopropyl)amine, bis(4-aminobutyl)amine, bis(5-aminopentyl)amine, N-(6-aminohexyl)-1,6-hexanediamine, hexahydro-1,3,5-triazine, N-methylethylenediamine, N-ethylethylenediamine, N-propylethylenediamine, N-butylethylenediamine, N-methyl-1,3-diaminopropane, N-methyl-1,4-diaminobutane, N-methyl-1,5-diaminopentane, N-methyl-1,6-diaminohexane, N-methyl-1,7-diaminoheptane, N-methyl-1,8-diaminooctane, N-methyl-1,9-diaminononane, N-methyl-1,10-diaminodecane, N-methyl-1,11-diaminoundecane, N-methyl-1,12-diaminododecane, 1,3-bis(aminomethyl)cyclohexane, 1,4-bis(aminomethyl)cyclohexane, piperazine and derivatives thereof, without being limited thereto.

The amine compound may be present in an amount of about 0.001 wt % to about 1 wt % based on the total weight of the slurry composition for CMP. Alternatively, the amine compound may be present in an amount of about 0.005 wt % to about 0.5 wt % based on the total weight of the slurry composition for CMP. Alternatively, the amine compound may be present in an amount of about 0.01 wt % to about 0.1 wt % based on the total weight of the slurry composition for CMP.

If the amount of the amine compound in the slurry composition for CMP is too low, dishing may be severely generated. If the amount of the amine compound in the slurry composition for CMP is too high, the stability of the slurry composition for CMP may be deteriorated.

According to embodiments, the slurry composition for CMP, which includes the fullerenol-based polishing particles and exhibits excellent polishing properties, may be prepared at low cost and in large quantities.

Hereinafter, a method of preparing a slurry composition for CMP, according to embodiments, will be described.

Figure 2:
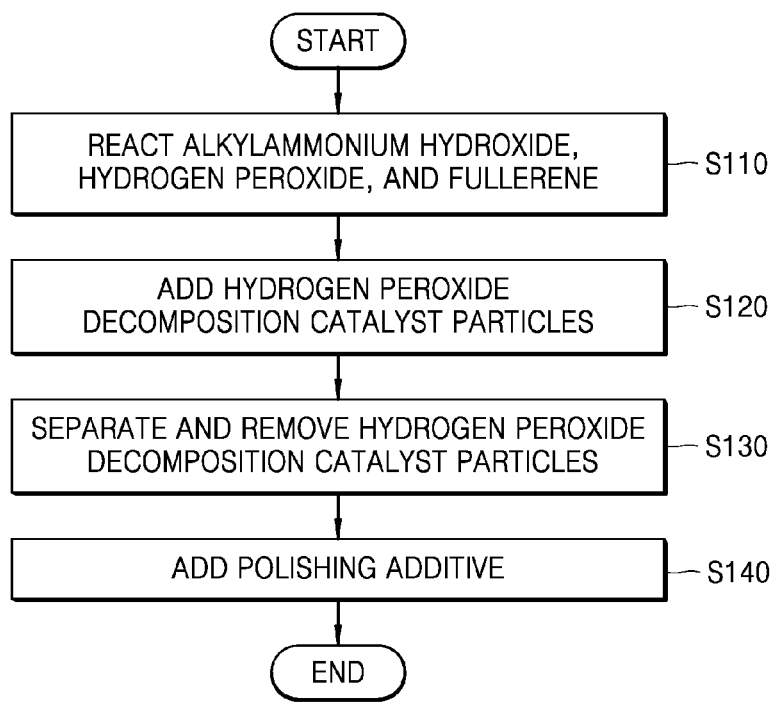
FIG. 2 is a flowchart illustrating a method of preparing a slurry composition for chemical mechanical polishing (CMP), according to an exemplary embodiment.

FIG. 2 is a flowchart illustrating a method of preparing a slurry composition for CMP, according to an embodiment.

FIGS. 3A to 3F are conceptual diagrams schematically illustrating the method of preparing a slurry composition for CMP.

Figure 3A:
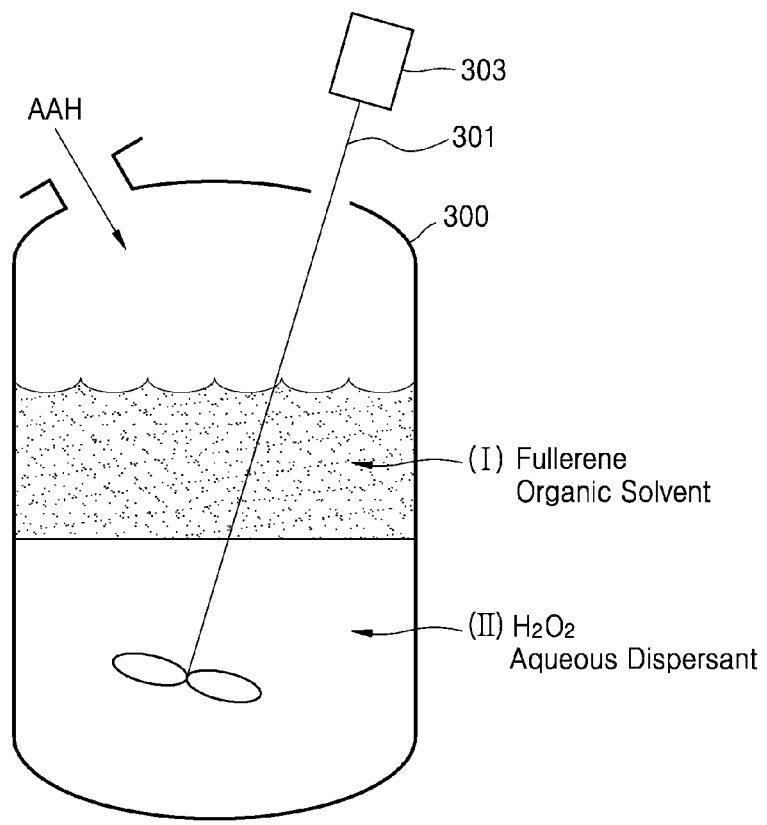
FIGS. 3A to 3F are conceptual diagrams schematically illustrating the method of preparing a slurry composition for CMP, according to certain exemplary embodiments.

Referring to FIGS. 2 and 3A, a mixture of an organic solvent and fullerene, which constitute a first phase I, and a mixture of hydrogen peroxide and an aqueous dispersant, which constitute a second phase II, are supplied into a reaction vessel 300 (S110).

Since the aqueous dispersant (for example, deionized water) and the organic solvent (for example, toluene) are immiscible with each other, the phases are separated according to specific gravities. In FIG. 3A, the first phase I is shown as being located above the second phase II. Since the fullerene is present only in the first phase I, the first phase I may be opaque, and the second phase II may be transparent.

Next, as a phase transfer catalyst provoking a two phase reaction, an alkyammonium hydroxide (AAH) may be supplied into the reaction vessel 300.

Figure 3B:
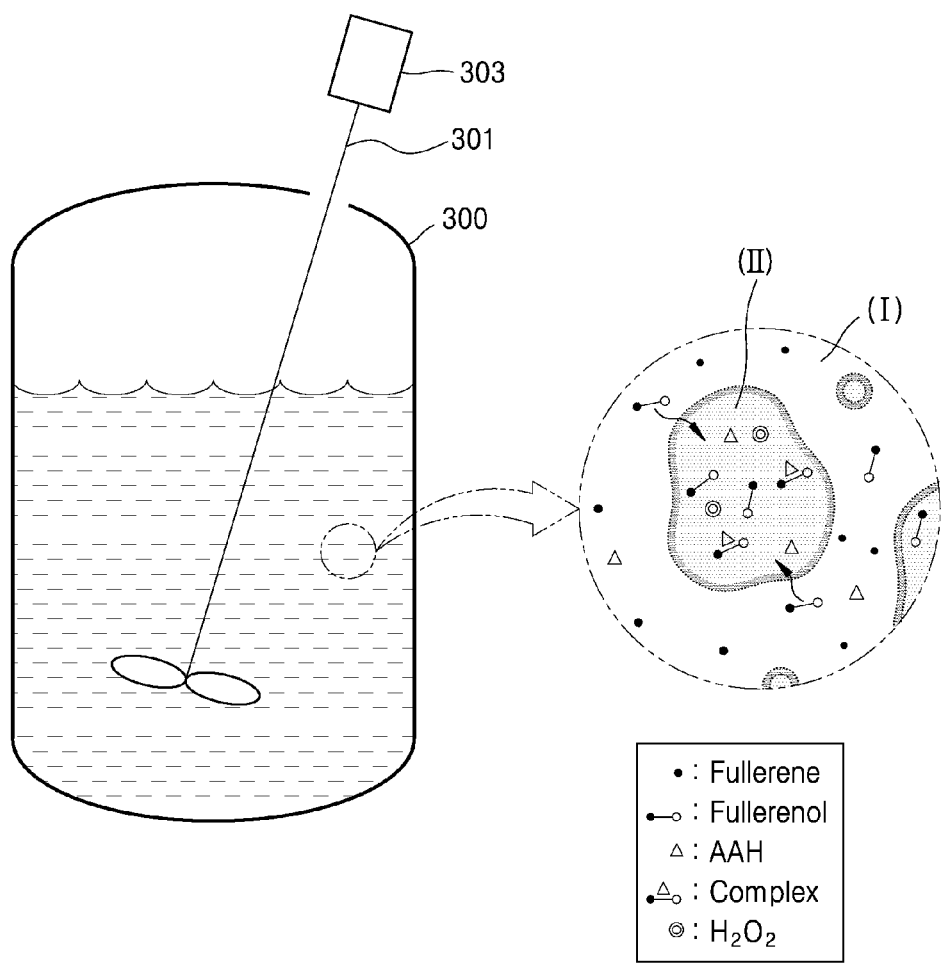

Next, referring to FIG. 3B, the materials in the reaction vessel 300 are stirred by using a stirrer 301, which is driven by a stirring driver 303, thereby mixing the first phase I with the second phase II and preparing fullerenol and a fullerenol complex compound. By the stirring driven by a stirring driver 303, a chemical reaction and mass transfer occur between the first phase I and the second phase II while the first phase I and the second phase II have a larger contact area therebetween.

Specifically, since the fullerene (●) in the first phase I is dispersible in the organic solvent and not dispersible in the aqueous dispersant, the fullerene (●) is not diffused in the second phase II. The fullerene (●) may react with the alkyammonium hydroxide (Δ) in the first phase I and thus form fullerenol (●-○).

Since the fullerenol (●-○) is dispersed well even in the aqueous dispersant due to a hydroxyl group (-○), the fullerenol (●-○) may be actively diffused in the second phase II. The fullerenol (●-○) diffused in the second phase II reacts with hydrogen peroxide (⊙), whereby the number of hydroxyl groups bonded to a surface of the fullerene is increased. The fullerenol (●-○) having an increased number of hydroxyl groups forms a complex compound in conjunction with the alkyammonium hydroxide (Δ) that is also present in the second phase II. Unreacted hydrogen peroxide (⊙) not involved in the reaction may be present in the second phase II.

The reaction set forth above may be performed at an increased temperature, for example, a temperature of about 50° C. to about 100° C., for 5 hours to about 25 hours.

If the reaction temperature is too low, there may be an economic drawback due to a low reaction rate. If the reaction temperature is too high, the yield of a wanted product may be reduced due to a side reaction. If the reaction time is too short, a product may not be sufficiently produced. If the reaction time is too long, there is an economic drawback due to almost no additional reaction caused by saturation of the reaction.

Figure 3C:
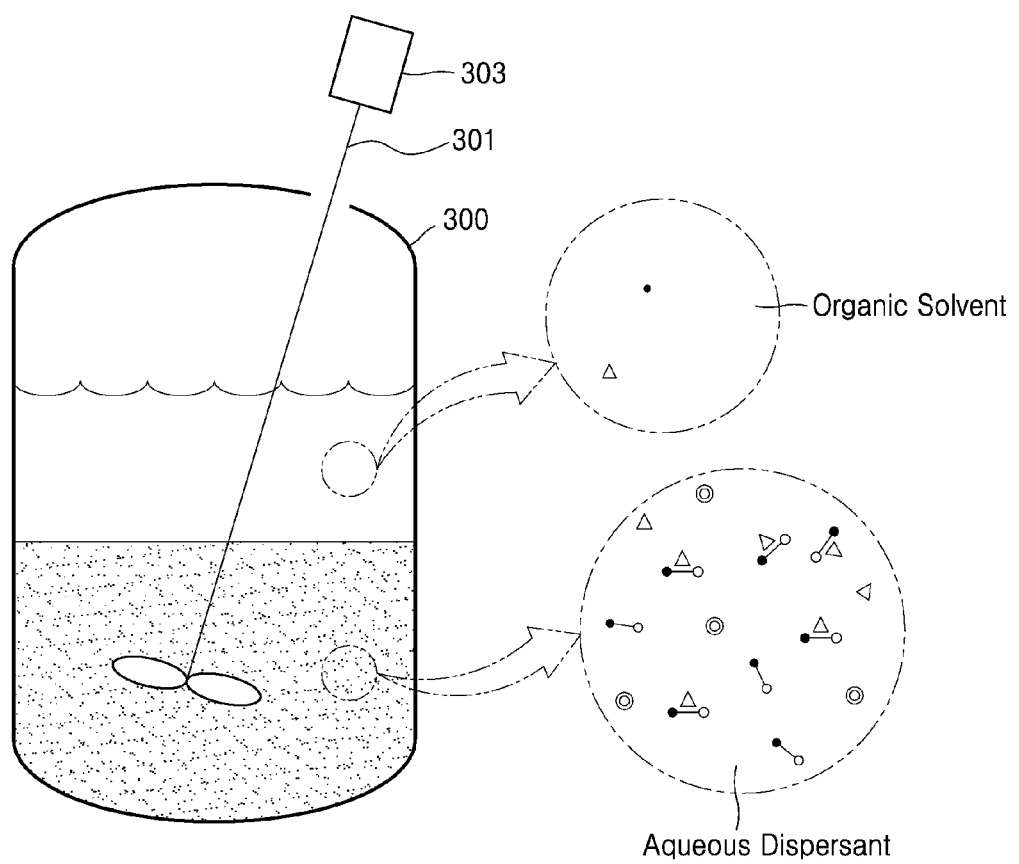

Referring to FIG. 3C, when the first phase I and the second phase II are stabilized and thus separated up and down again from each other (e.g., second phase II below the first phase I), there may be almost no fullerene (●) in the first phase I. In the second phase II, the fullerenol (●-○), the fullerenol complex compound, and unreacted hydrogen peroxide (⊙) are mixed. Since the fullerenol and the fullerenol complex compound are present in the second phase II, the second phase II may be opaque, and the first phase I may be transparent.

Next, the first phase I may be removed, and only the second phase II may remain.

Figure 3D:
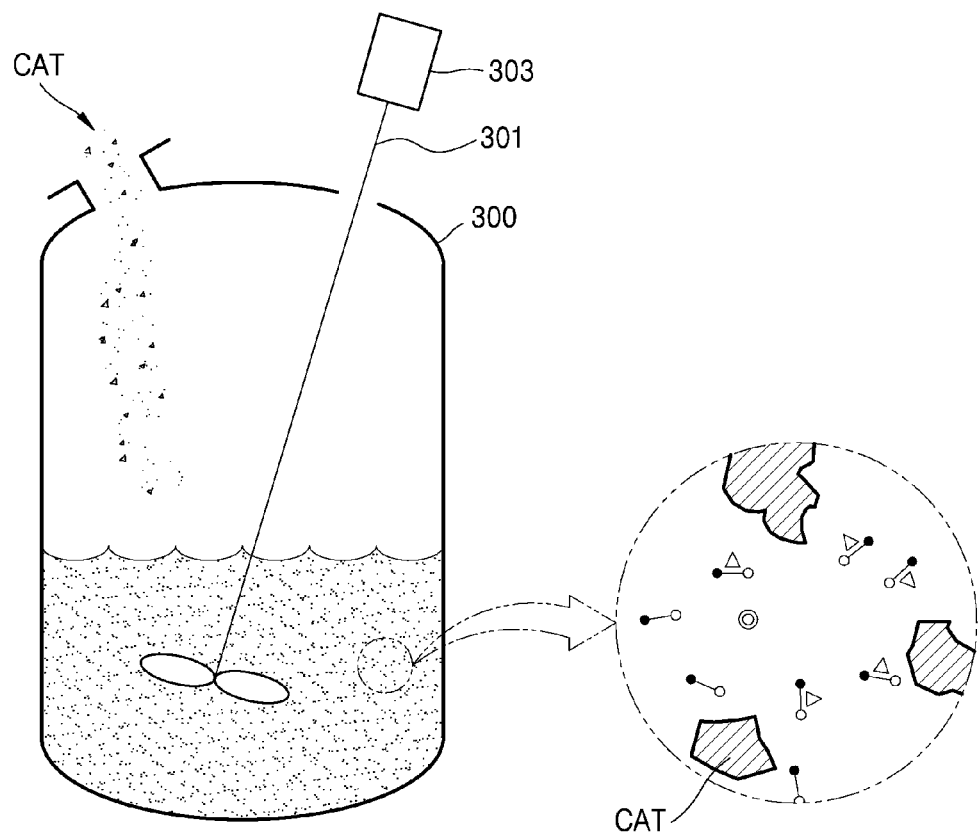

Referring to FIGS. 2 and 3D, a hydrogen peroxide decomposition catalyst CAT may be introduced into the second phase II (S120).

The hydrogen peroxide decomposition catalyst CAT may be solid particles that have a diameter of about 0.01 mm to about 5 mm. However, solid particles having smaller sizes than the diameter set forth above may also be used as long as they can be separated and removed afterward with ease. In addition, the hydrogen peroxide decomposition catalyst CAT having a larger diameter than 5 mm may also be used as long as a sufficient reaction rate is achieved. The diameters of the particles referenced herein may be a 'particle diameter' indicating a distance between two farthest points of each particle, and/or an 'average diameter' of the particles that indicates an arithmetic average of particle diameters of the particles.

The hydrogen peroxide decomposition catalyst CAT may include manganese dioxide ($MnO_2$) or a noble metal. The noble metal may include at least one selected from the group consisting of platinum (Pt), palladium (Pd), nickel (Ni), ruthenium (Ru), rhodium (Rh), silver (Ag), iridium (Ir), gold (Au), rhenium (Re), titanium (Ti), and tantalum (Ta). In addition, the noble metal may be used while being supported on a carrier such as alumina ($Al_2O_3$).

Although a mechanism, by which the hydrogen peroxide decomposition catalyst CAT decomposes and removes hydrogen peroxide, may be represented by Reaction Formula 1 and Reaction Formula 2, it is not intended to limit the embodiments to a specific theory.

$$H_2O_2 \rightarrow O_2 + 2H^+ + 2e^-$$ [Reaction Formula 1]

$$H_2O_2 + 2H^+ + 2e^- \rightarrow 2H_2O$$ [Reaction Formula 2]

Hydrogen peroxide may be removed from the mixture by the above reaction.

Figure 3E:
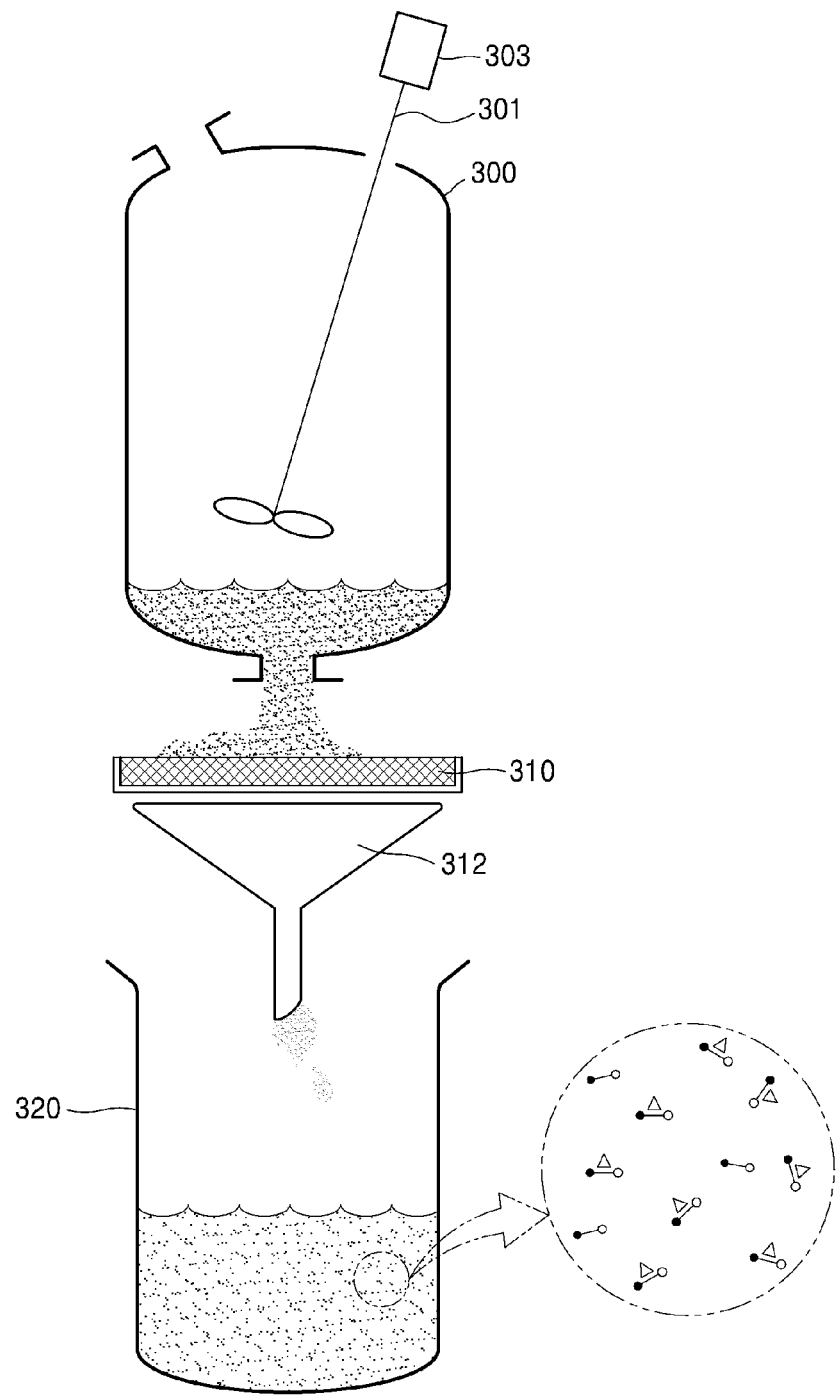

Referring to FIGS. 2 and 3E, the hydrogen peroxide decomposition catalyst CAT may be separated and removed by filtration (S130).

The mixture obtained in FIG. 3D may be passed through a filter 310 and a collector 312, thereby obtaining the mixture, from which the hydrogen peroxide decomposition catalyst CAT is removed, in a collection container 320. In the mixture collected in the collection container 320, the fullerenol and the fullerenol complex compound may be dispersed in the aqueous dispersant.

Figure 3F:
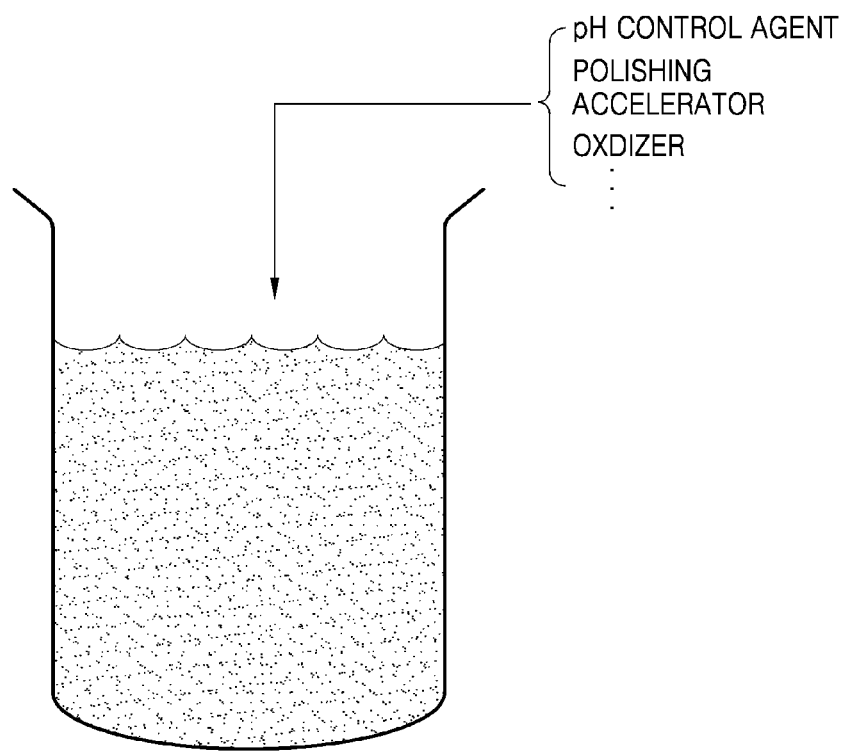

Referring to FIGS. 2 and 3F, a polishing additive may be added into the mixture, thereby obtaining a slurry composition for CMP (S140).

For example, the polishing additive may include at least one selected from among a pH control agent, a polishing accelerator, an oxidizer, a dispersion stabilizer, a surfactant, a polishing inhibitor, a leveling agent, a corrosion inhibitor, and an amine compound. However, the embodiments are not limited thereto.

As described above, since hydrogen peroxide may be removed from the mixture in a simple and efficient manner, the fullerenol (and the complex compound thereof) may be prepared in a simple and low-cost manner.

According to the related art, to obtain fullerenol, a two-step method has been used, in which a surface of fullerene is partially hydroxylated first in an organic solvent, followed by separating the fullerene and bonding a large number of hydroxyl groups to the fullerene in an aqueous dispersant by using hydrogen peroxide.

According to the method of the related art, since synthesis of the fullerenol is cumbersome, and processes of centrifuging and cleaning the fullerenol by using a high-priced organic solvent are repeated to separate the final fullerenol from hydrogen peroxide, processes are complicated and cumbersome, and high cost is incurred. On the other hand, as described above, according to the disclosed embodiments, since the fullerenol is synthesized in one pot and separated in situ from hydrogen peroxide by chemical decomposition of hydrogen peroxide, the fullerenol (and the complex compound thereof) may be prepared in a simple and low-cost manner.

Hereinafter, although the concepts will be described in more detail with reference to specific examples and comparative examples, these examples are provided merely for clear understanding and are not intended to limit the scope of the inventive concepts.

1.00 g of C60 fullerene (96% or more, Frontier Carbon Co., Ltd.) was dispersed in 500 ml of toluene, followed by adding 50 ml of a 30% hydrogen peroxide solution and a 40% tetra-n-butylammonium hydroxide (TBAH) aqueous solution as a phase transfer catalyst to the suspension. Then, the components were stirred at 70° C. for 16 hours.

Next, a toluene layer was removed, thereby obtaining an aqueous solution in which fullerenol was dispersed. 10 g of manganese dioxide was added to the aqueous solution, followed by leaving alone the aqueous solution for 10 hours. Then, manganese dioxide particles were removed by filtration, thereby obtaining a fullerenol complex compound.

Next, an amount of polishing particles for each of Examples and Comparative Examples was adjusted as listed in Table 1, thereby obtaining compositions according to Examples and Comparative Examples.

TABLE 1

|  | Polishing particles | Amount of Polishing particles (wt %) |
|---|---|---|
| Example 1 | $C_{60}(OH)_{44}$-TBAH complex compound | 0.006 |
| Example 2 | $C_{60}(OH)_{44}$-TBAH complex compound | 0.02 |
| Example 3 | $C_{60}(OH)_{44}$-TBAH complex compound | 0.1 |
| Comparative Example 1 | $C_{60}(OH)_{44}$ | 0.006 |
| Comparative Example 2 | $C_{60}(OH)_{44}$ | 0.02 |
| Comparative Example 3 | $C_{60}(OH)_{44}$ | 0.1 |
| Comparative Example 4 | 30 nm Colloidal silica | 0.006 |
| Comparative Example 5 | 30 nm Colloidal silica | 0.02 |
| Comparative Example 6 | 30 nm Colloidal silica | 0.1 |

Glycine: 0.6 wt %
$H_2O_2$: 1.0 wt %
Benzotriazole: 0.02 wt %
Bicine: 0.2 wt %

After each slurry composition for CMP was prepared according to components and amounts thereof for each of Examples and Comparative Examples, polishing properties of each of the slurry compositions for CMP were evaluated on a specimen.

The specimen, on which an MIT854 pattern having a Ta/TaN barrier layer and Cu wiring lines in a TEOS dielectric was formed, was prepared to a size of 2 cm×2 cm and used. In particular, dishing was evaluated on a Cu line-and-space pattern in which lines respectively having a width of 100 μm were arranged at intervals of 100 μm.

An MA-200e polishing machine (Musashino Denshi Co., Ltd.) was used for polishing, and polishing was performed at a rotational speed of 90 rpm at a polishing pressure of 24 kPa by using an IC1010 polishing pad (Dow Chemical Co., Ltd.).

A dishing amount and a polishing rate were measured, and results are shown in Table 2.

TABLE 2

| | Cu material removal rate (nm/min) | Dishing (nm) |
|---|---|---|
| Example 1 | 130 | 23.5 |
| Example 2 | 138 | 23.6 |
| Example 3 | 160 | 22 |
| Comparative Example 1 | 129 | 35.7 |
| Comparative Example 2 | 131 | 35.6 |
| Comparative Example 3 | 145 | 34.5 |
| Comparative Example 4 | 89 | 88.3 |
| Comparative Example 5 | 95 | 85.6 |
| Comparative Example 6 | 120 | 85.3 |

As shown in Table 2, when the fullerenol was used (Comparative Examples 1 to 3), it was confirmed that dishing was improved as well as the removal rate was increased, as compared with Comparative Examples 4 to 6 using colloidal silica. Specifically, there were increases of 45% (Comparative Example 1), 38% (Comparative Example 2), and 21% (Comparative Example 3) in the removal rate, and reductions of 58% to 60% in dishing, as compared with Comparative Examples 4 to 6, respectively.

In addition, when the fullerenol complex compound was used (Examples 1 to 3), it was confirmed that dishing was significantly improved and the removal rate was slightly increased, as compared with Comparative Examples 1 to 3 using the fullerenol. Specifically, there were increases of 1% (Example 1), 5.3% (Example 2), and 10% (Example 3) in the removal rate, and reductions of 34% to 36% in dishing, as compared with Comparative Examples 1 to 3, respectively.

Hereinafter, the fabrication of a semiconductor device by using the slurry composition for CMP will be described.

Figure 4:
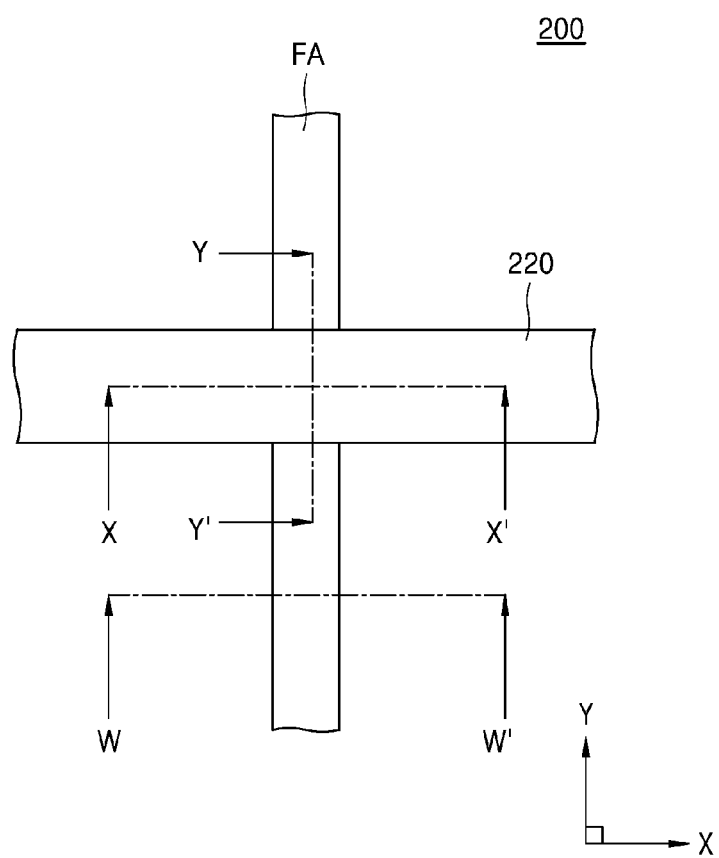
FIG. 4 is a plan view of a semiconductor device provided on a semiconductor substrate, according to certain exemplary embodiments.

FIG. 4 is a plan view of a semiconductor device 200 provided on a semiconductor substrate.

FIGS. 5A to 5F are cross-sectional views illustrating sequential processes of a method of fabricating a semiconductor device, according to an embodiment. In each of FIGS. 5A to 5F, a YY' cross-section and a WW' cross-section, respectively corresponding to the YY' cross-section and the WW' cross-section of FIG. 4, are shown. As discussed more fully below, the embodiment disclosed in FIGS. 5A to 5F illustrate a method of fabricating a semiconductor device that includes providing a pattern (e.g., a semiconductor pattern) that defines a trench, then forming a metal material film on the semiconductor pattern to fill the trench. In addition, the method includes performing chemical mechanical polishing (CMP) of the metal material film using the slurry composition for CMP such that the metal material film may be defined within the trench. For example, the metal material film may be removed from areas other than the trench, and thus may remain only within the trench.

Figure 5A:
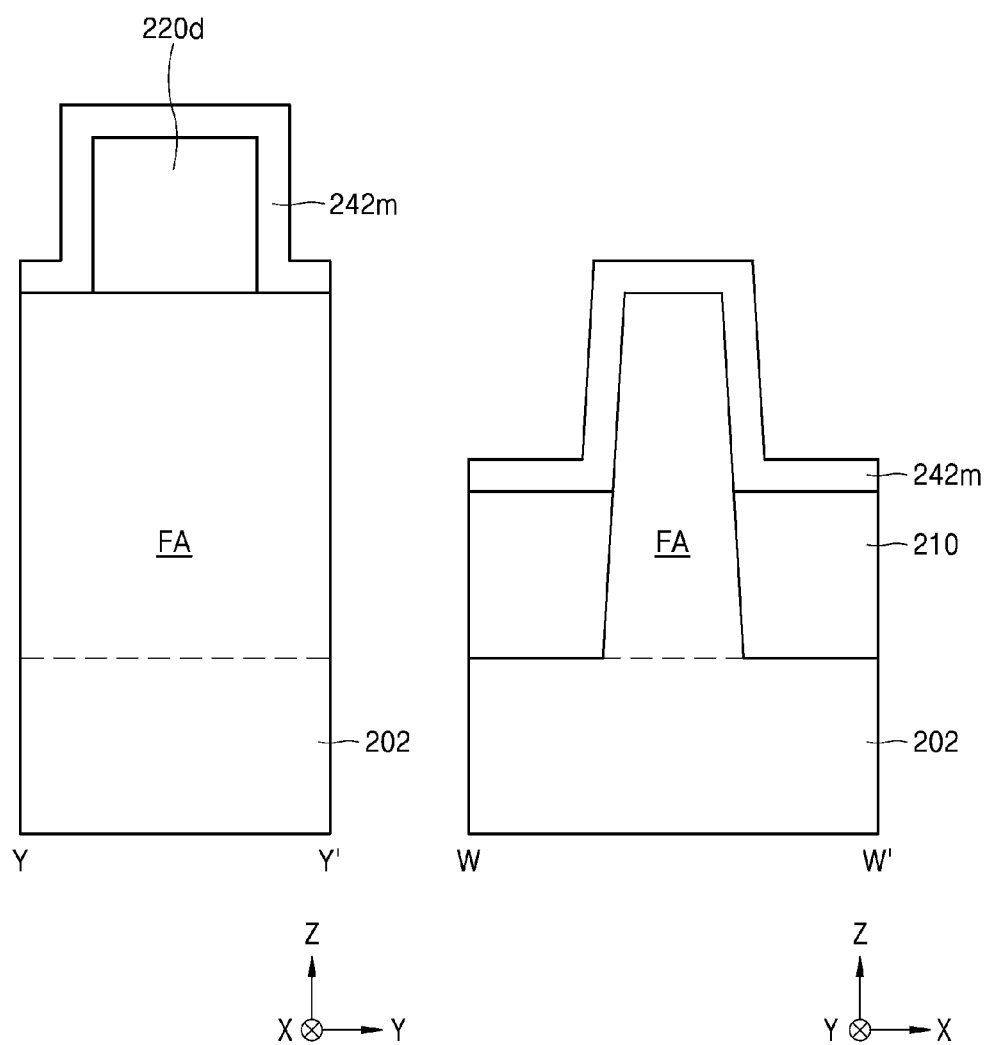
FIGS. 5A to 5F are cross-sectional views illustrating sequential processes of a method of fabricating a semiconductor device, according to an exemplary embodiment.

Referring to FIGS. 4 and 5A, the semiconductor device 200 includes a fin-type active region FA protruding from a substrate 202.

Referring to FIG. 5A, a dummy gate electrode 220d may be formed on the substrate 202 in which the fin-type active region FA is defined by a device isolation film 210, followed by conformally depositing a spacer material film 242m on entire surfaces of the substrate 202 and the dummy gate electrode 220d.

The substrate 202 may include at least one of a Group III-V material and a Group IV material. The Group III-V material may be a binary, ternary, or quaternary compound including at least one Group III element and at least one Group V element. The Group III-V material may be a compound including at least one of In, Ga, and Al as a Group III element and at least one of As, P, and Sb as a Group V element. For example, the Group III-V material may be selected from InP, $In_zGa_{1-z}As$ (0≤z≤1), and $Al_zGa_{1-z}As$ (0≤z≤1). For example, the binary compound may be one of InP, GaAs, InAs, InSb, and GaSb. The ternary compound may be one of InGaP, InGaAs, AlInAs, InGaSb, GaAsSb, and GaAsP. The Group IV material may be Si and/or Ge. However, the Group III-V material and the Group IV material, which may be used to form a semiconductor device, are not limited to the examples set forth above.

The Group III-V material and the Group IV material such as Ge may be used as a channel material allowing a low-power high-speed transistor to be made. A high-performance complementary metal-on-oxide semiconductor (CMOS) may be formed by using a semiconductor substrate including a Group III-V material, for example, GaAs, which has a higher electron mobility than Si, and using a semiconductor substrate including a semiconductor material, for example, Ge, which has a higher hole mobility than Si. In some embodiments, when it is intended to form an N-type channel in the substrate 202, the substrate 202 may include one of the examples of Group III-V materials set forth above or include SiC. In some other embodiments, when it is intended to form a P-type channel in the substrate 202, the substrate 202 may include SiGe.

The dummy gate electrode 220d may include, for example, polysilicon, without being limited thereto. The dummy gate electrode 220d may be provided to secure both a location and a space, in which a gate electrode is to be formed later.

The spacer material film 242m may include a low-K material film. In some embodiments, the spacer material film 242m may include a SiOCN material film. In some embodiments, the spacer material film 242m may include a single material film including SiOCN. In some embodiments, the spacer material film 242m may include a multiple material film in which two or more material films including SiOCN are stacked.

Figure 5B:
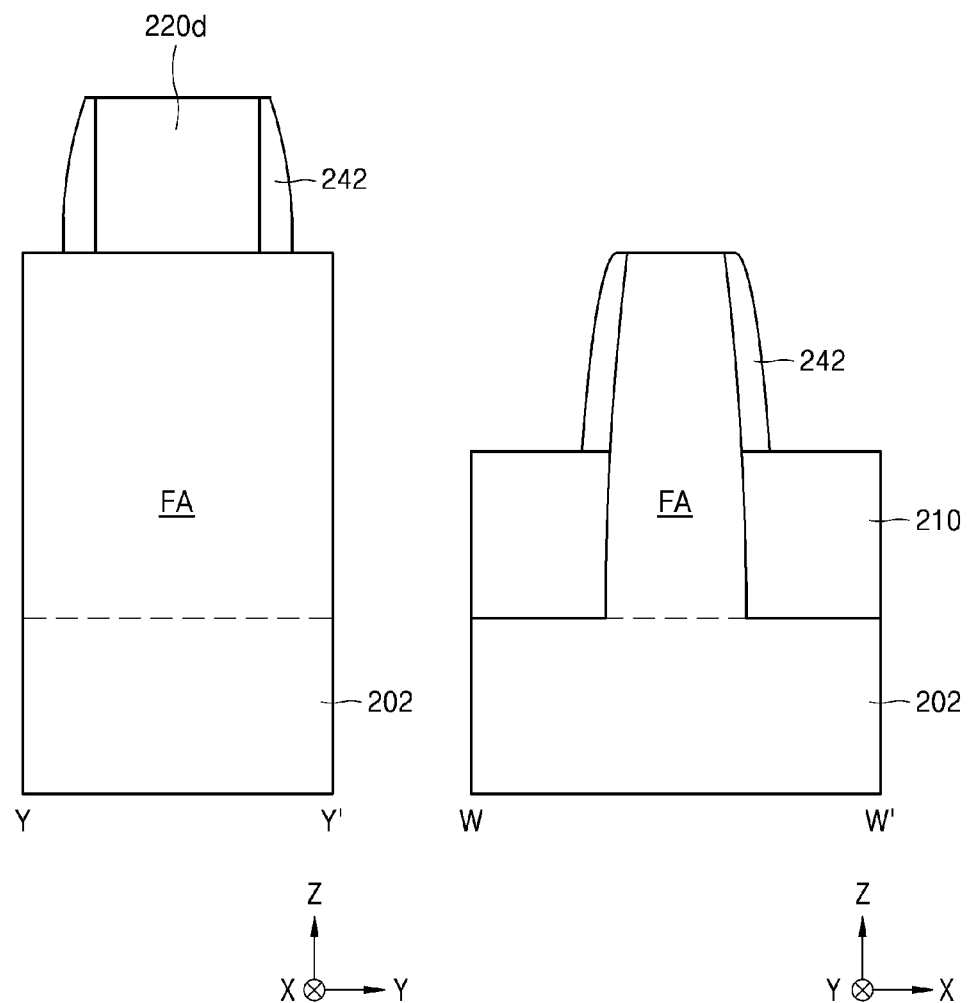

Referring to FIG. 5B, a spacer 242 is formed by anisotropically etching the spacer material film 242m. The spacer 242 may be formed on a sidewall of the dummy gate electrode 220d. In addition, the spacer 242 may be formed on a sidewall of the fin-type active region FA on both sides of the dummy gate electrode 220d.

Figure 5C:
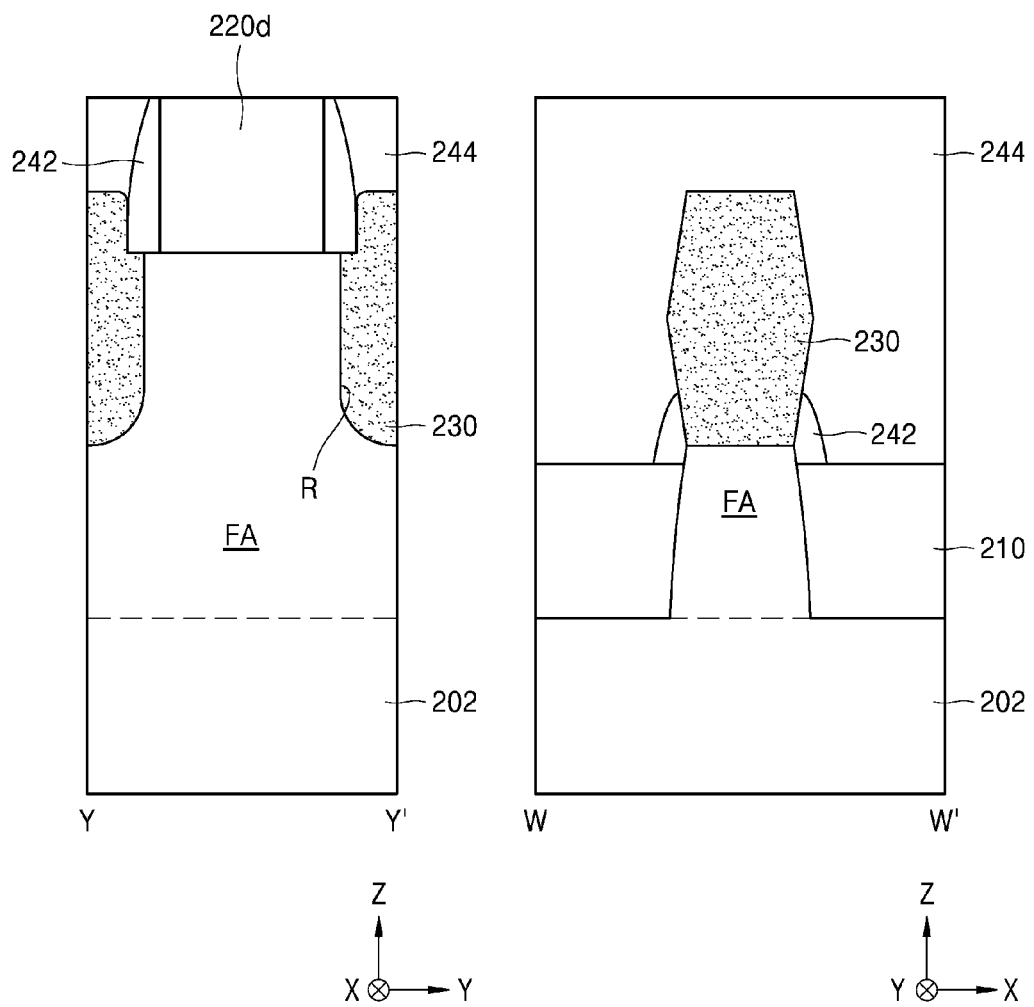

Referring to FIG. 5C, the fin-type active region FA may be partially removed by using the dummy gate electrode 220d and the spacer 242 as an etch mask.

To partially remove the fin-type active region FA, anisotropic etching and/or isotropic etching may be performed. In particular, to expose at least a portion of a bottom surface of the spacer 242 formed on the sidewall of the dummy gate electrode 220d, partial etching of the fin-type active region FA may be performed by combining anisotropic etching and isotropic etching.

More specifically, the exposed fin-type active region FA may be anisotropically etched by as much as a predetermined depth and then may be isotropically etched by wet etching. An etchant for wet etching may include, for example, an $NH_4OH$ solution, tetramethylammonium hydroxide (TMAH), an HF solution, an $NH_4F$ solution, or a mixture thereof. However, the etchant is not limited thereto.

A recess may be formed by anisotropic etching using the spacer 242 as an etch mask, and wet etching may be performed on the recess, thereby obtaining a recess R, which exposes a portion of the bottom surface of the spacer 242, as shown in FIG. 5C. In particular, the recess R may expose at least a portion of the bottom surface of the spacer 242 at an impurity region side.

In some embodiments, wet etching performed to expose the portion of the bottom surface of the spacer 242 may be omitted.

Next, to form an impurity region 230, a source/drain material layer may be formed in the recess R. Although the source/drain material layer may include Si, SiC, SiP, or SiGe, the embodiments are not limited thereto. The source/drain material layer may be formed, for example, by epitaxial growth. Impurities may be implanted in situ during epitaxial growth of the source/drain material layer, or may be implanted by ion implantation after forming the source/drain material layer. In addition, a top surface of the impurity region 230 may be at a higher level than a top surface of the fin-type active region FA.

Next, an interlayer dielectric 244 may be formed on the impurity region 230. The interlayer dielectric 244 may include, for example, silicon oxide, without being limited thereto.

Figure 5D:
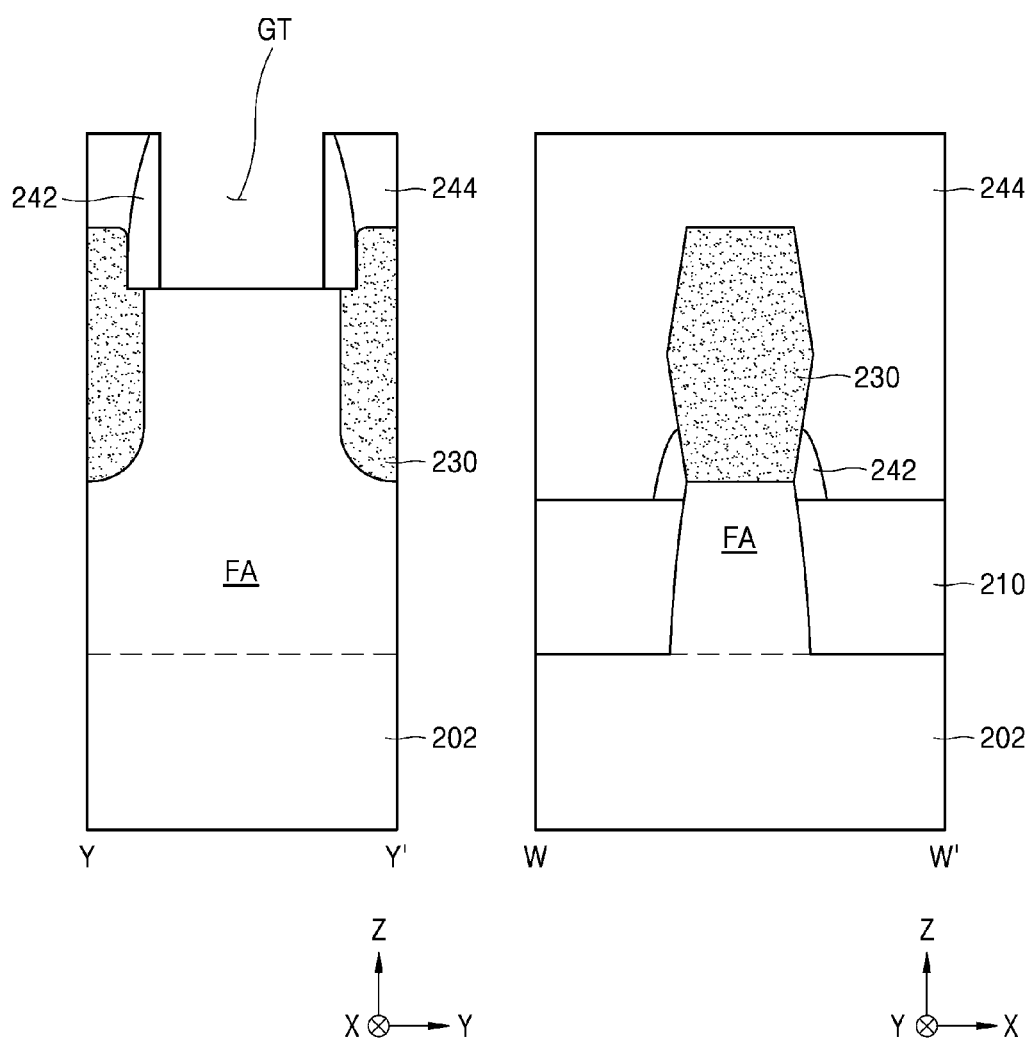

Referring to FIG. 5D, a gate trench GT may be formed by removing the dummy gate electrode 220d. A portion of a top surface of the substrate 202 may be exposed by the gate trench GT. The portion of the substrate 202 exposed by the gate trench GT may correspond to a channel region of the semiconductor device 200 that is to be fabricated afterward.

The dummy gate electrode 220d may be removed, for example, by dry etching or wet etching.

Figure 5E:
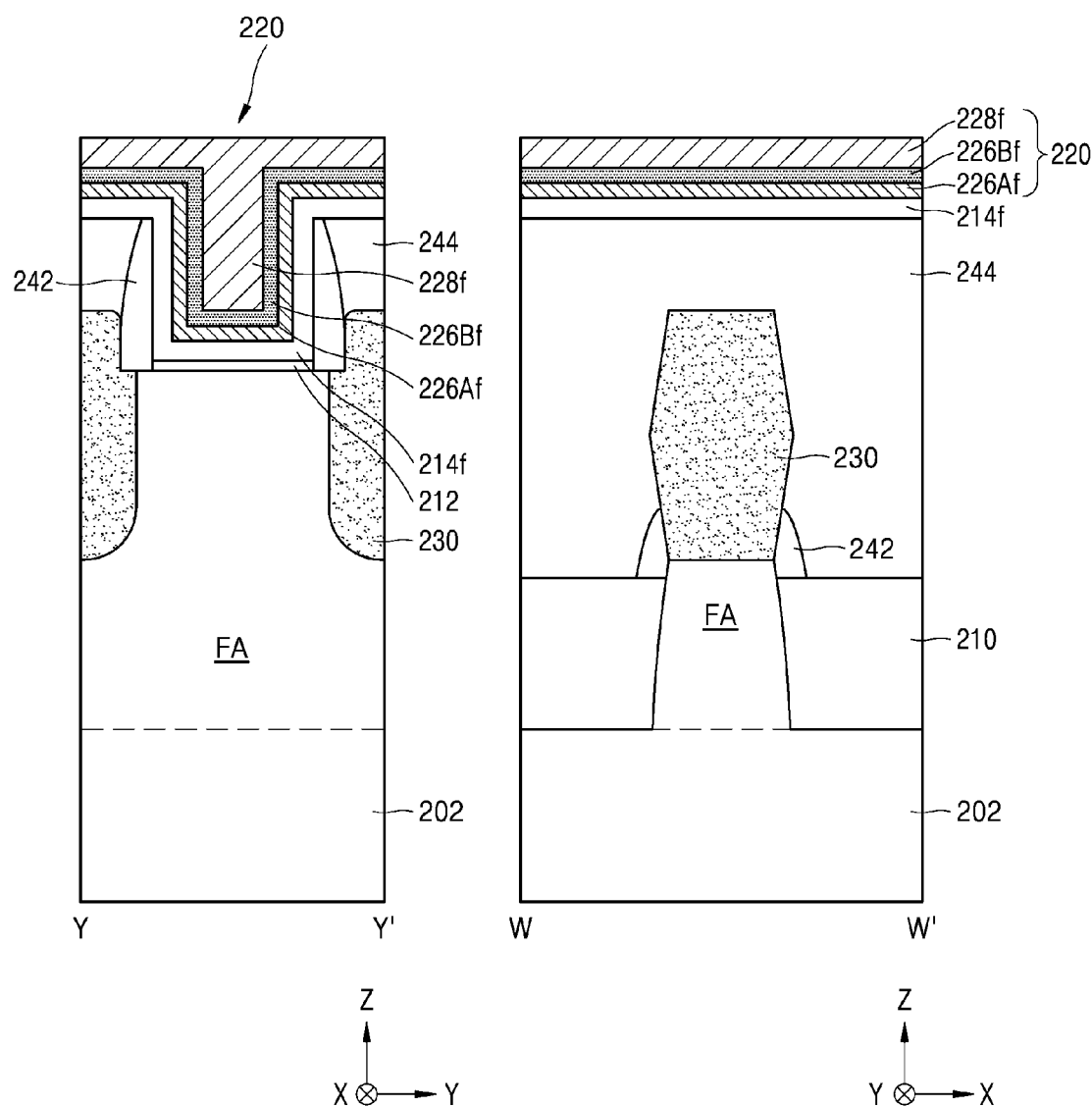

Referring to FIG. 5E, an interfacial layer 212 may be formed. Next, a high-K material film 214f, a first metal-containing material film 226Af, a second metal-containing material film 226Bf, and a gap-fill metal material film 228f are formed, in this stated order, on the interfacial layer 212, a sidewall of the gate trench GT, and a top surface of the interlayer dielectric 244. In particular, the high-K material film 214f, the first metal-containing material film 226Af, and the second metal-containing material film 226Bf may be conformally formed along each of surfaces of the interfacial layer 212, the gate trench GT, and the interlayer dielectric 244. In addition, the gap-fill metal material film 228f may be formed to fill a trench formed by the second metal-containing material film 226Bf.

Each of the high-K material film 214f, the first metal-containing material film 226Af, the second metal-containing material film 226Bf, and the gap-fill metal material film 228f may be independently formed by an atomic layer deposition (ALD), chemical vapor deposition (CVD), or physical vapor deposition (PVD) process. However, the embodiments are not limited thereto.

The high-K material film 214f may include a material having a higher dielectric constant than a silicon oxide film. For example, the high-K material film 214f may have a dielectric constant of about 10 to about 25. The high-K material film 214f may include a material selected from among zirconium oxide, zirconium silicon oxide, hafnium oxide, hafnium oxynitride, hafnium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof. However, the material constituting the high-K material film 214f is not limited to the examples set forth above.

In some embodiments, the first metal-containing material film 226Af may include a nitride of Ti, a nitride of Ta, an oxynitride of Ti, or an oxynitride of Ta. For example, the first metal-containing material film 226Af may include TiN, TaN, TiAlN, TaAlN, TiSiN, or a combination thereof.

In some embodiments, the second metal-containing material film 226Bf may include an N-type metal-containing layer needed for an NMOS transistor that includes an Al compound containing Ti or Ta. For example, the second metal-containing material film 226Bf may include TiAlC, TiAlN, TiAlCN, TiAl, TaAlC, TaAlN, TaAlCN, TaAl, or a combination thereof.

In some other embodiments, the second metal-containing material film 226Bf may include a P-type metal-containing layer needed for a PMOS transistor. For example, the second metal-containing material film 226Bf may include at least one of Mo, Pd, Ru, Pt, TiN, WN, TaN, Ir, TaC, RuN, and MoN.

The gap-fill metal material film 228f may be formed to fill a remaining gate space above the second metal-containing material film 226Bf when a gate structure 220 is formed by a replacement metal gate (RMG) process.

The gap-fill metal material film 228f may include a material selected from the group consisting of metal nitrides such as WN, TiN, and TaN, W, Cu, Co, Al, metal carbides, metal silicides, metal aluminum carbides, metal aluminum nitrides, and metal silicon nitrides.

Figure 5F:
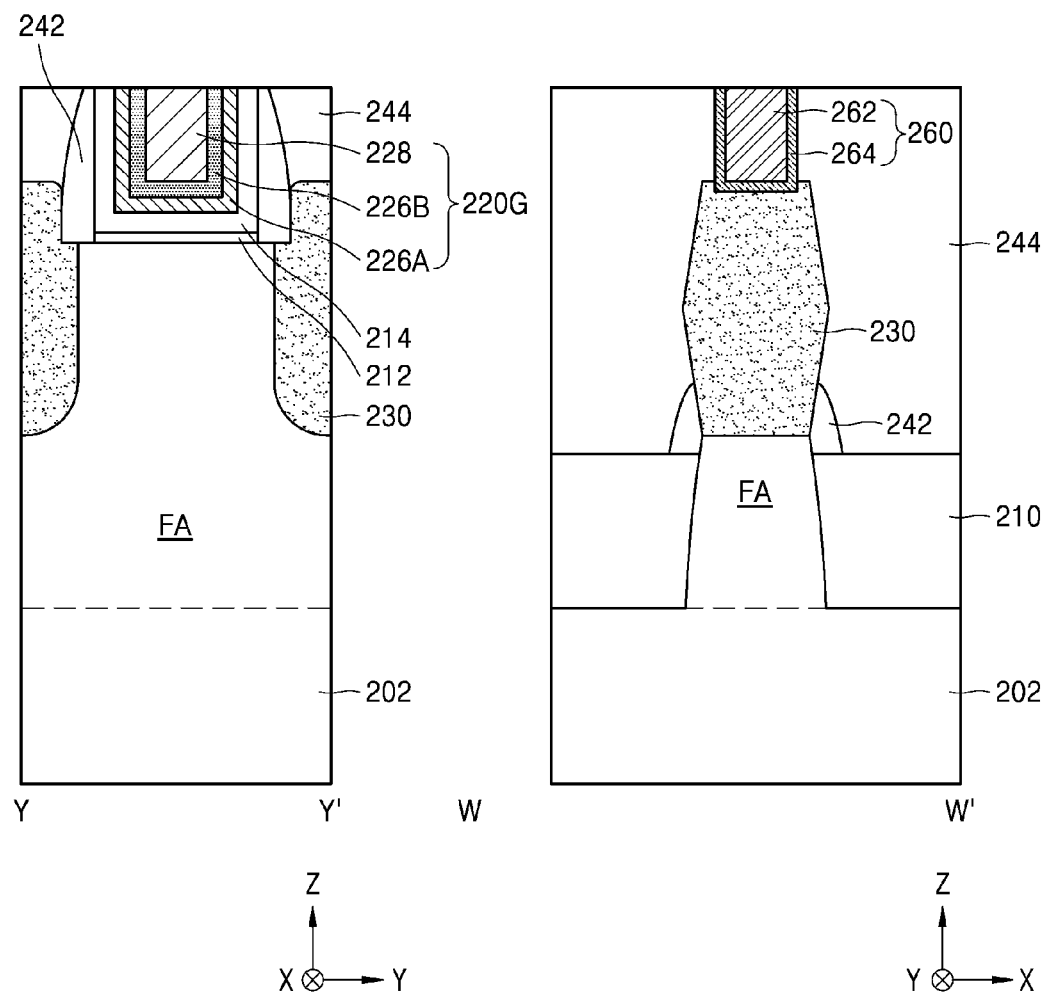

Referring to FIG. 5F, planarization may be performed such that the top surface of the interlayer dielectric 244 is exposed, thereby finally obtaining the semiconductor device 200. The planarization may be may be performed, for example, by using the slurry composition for CMP, which has been described above. As described above, for example, CMP may be performed such that the top surface of the interlayer dielectric 244 is exposed. In some embodiments, after planarization, the top surface of the gap-fill metal material film 228 may be coplanar with the top surface of the interlayer dielectric 244.

A contact 260 may be connected onto the impurity region 230 constituting a source/drain region. The contact 260 may include a conductive barrier film 264 and a wiring layer 262. In some embodiments, the conductive barrier film 264 may include titanium nitride, tantalum nitride, tungsten nitride, titanium carbon nitride, or a combination thereof, without being limited thereto. In some embodiments, the wiring layer 262 may include a doped semiconductor, a metal such as Cu, Ti, W, or Al, a metal silicide such as nickel silicide, cobalt silicide, tungsten silicide, or tantalum silicide, or a combination thereof, without being limited thereto. The gate electrode 220G may be electrically insulated from the contact 260 by the interlayer dielectric 244.

Although the source/drain region, which is an impurity region, is shown in FIGS. 5A to 5F as having a raised source/drain (RSD) structure, the embodiments are not limited thereto. For example, the impurity region 230 may include an impurity-doped region formed in a corresponding area of the fin-type active region FA.

While the inventive concept has been particularly shown and described with reference to embodiments thereof, it will be understood that various changes in form and details may be made therein without departing from the spirit and scope of the following claims.

What is claimed is:

1. A method of preparing a slurry composition for chemical mechanical polishing (CMP), the method comprising:
   obtaining a mixture of a fullerenol complex compound and unreacted hydrogen peroxide by reacting alkylammonium hydroxide, hydrogen peroxide, and fullerene;

removing the unreacted hydrogen peroxide by adding hydrogen peroxide decomposition catalyst particles to the mixture;

separating the hydrogen peroxide decomposition catalyst particles from the mixture by filtration; and adding a polishing additive to the mixture.

2. The method according to claim 1, wherein the obtaining of the mixture of the fullerenol complex compound and the unreacted hydrogen peroxide is performed at a temperature of about 50° C. to about 100° C. for about 5 hours to about 25 hours.

3. The method according to claim 1, wherein the polishing additive comprises at least one of a pH control agent, a polishing accelerator, an oxidizer, a dispersion stabilizer, a surfactant, a polishing inhibitor, a leveling agent, a corrosion inhibitor, and an amine compound.

4. The method according to claim 1, wherein the alkylammonium hydroxide has a structure represented by Chemical Formula 2:

$$R_xH_{4-x}N(OH) \quad \text{[Chemical Formula 2]}$$

where R is a C1 to C8 alkyl group, and x is an integer ranging from 1 to 4.

5. The method according to claim 1, wherein the obtaining of the mixture of the fullerenol complex compound and the unreacted hydrogen peroxide is performed by a two-phase reaction.

6. The method according to claim 5, wherein the two-phase reaction comprises bringing a first phase into contact with a second phase, the first phase comprising the fullerene dispersed in an organic solvent, and the second phase comprising hydrogen peroxide.

7. The method according to claim 6, wherein the alkylammonium hydroxide acts as a phase transfer catalyst.

8. The method according to claim 6, wherein the fullerene in the first phase is converted into fullerenol by the alkylammonium hydroxide and then transferred to the second phase.

9. The method according to claim 6, further comprising: separating the second phase from the first phase, before the removing of the unreacted hydrogen peroxide.

10. The method according to claim 6, wherein the hydrogen peroxide decomposition catalyst particles comprise at least one selected from the group consisting of manganese dioxide (MnO$_2$), platinum (Pt), palladium (Pd), nickel (Ni), ruthenium (Ru), rhodium (Rh), silver (Ag), iridium (Ir), gold (Au), rhenium (Re), titanium (Ti), and tantalum (Ta).

11. A method of preparing a slurry composition for chemical mechanical polishing (CMP), the method comprising:

mixing and stirring a first phase and a second phase in the presence of alkylammonium hydroxide, the first phase comprising fullerene dispersed in an organic solvent, and the second phase comprising hydrogen peroxide;

performing phase separation between the first phase and the second phase and then removing the first phase;

removing unreacted hydrogen peroxide by adding, into the second phase, hydrogen peroxide decomposition catalyst particles having diameters of about 0.01 mm to about 5 mm;

separating the hydrogen peroxide decomposition catalyst particles by filtering the second phase; and adding a polishing additive to a residual mixture remaining after the separation of the hydrogen peroxide decomposition catalyst particles.

12. The method according to claim 11, wherein, in the removing of the unreacted hydrogen peroxide, the unreacted hydrogen peroxide is decomposed into water and oxygen by the hydrogen peroxide decomposition catalyst particles.

13. The method according to claim 11, wherein the second phase comprises an aqueous dispersant.

14. The method according to claim 11, wherein the residual mixture includes fullerenol and a fullerenol complex compound represented by Chemical Formula 3:

$$C_q(OH)_p \cdot R_xH_{4-x}N(OH) \quad \text{[Chemical Formula 3]}$$

where p is an arbitrary integer ranging from 10 to q; q is 20, 24, 26, 28, 32, 36, 50, 60, 70, 72, 74, 76, 78, 80, 82, 84, 100, or 200; R is a C1 to C8 alkyl group; and x is an integer ranging from 1 to 4.

15. A method of fabricating a semiconductor device, the method comprising:

providing a semiconductor pattern defining a trench;

forming a metal material film on the semiconductor pattern to fill the trench; and performing chemical mechanical polishing (CMP) of the metal material film by using a slurry composition for CMP such that the metal material film is defined within the trench, the slurry composition comprising polishing particles, the polishing particles comprising a complex compound of fullerenol and alkylammonium hydroxide.

16. The method according to claim 15, wherein the polishing particles are dispersion-treated such that surfaces of the polishing particles are negatively charged.

17. The method according to claim 15, wherein the fullerenol has a structure represented by Chemical Formula 1:

$$C_q(OH)_p \quad \text{[Chemical Formula 1]}$$

where p is an arbitrary integer ranging from 10 to q, and q is 20, 24, 26, 28, 32, 36, 50, 60, 70, 72, 74, 76, 78, 80, 82, 84, 100, or 200.

18. The method according to claim 17, wherein the alkylammonium hydroxide has a structure represented by Chemical Formula 2:

$$R_xH_{4-x}N(OH) \quad \text{[Chemical Formula 2]}$$

where R is a C1 to C8 alkyl group, and x is an integer ranging from 1 to 4.

19. The according to claim 18, wherein R of the alkylammonium hydroxide is an n-butyl group.

20. The method according to claim 19, wherein x is 3 or 4.

* * * * *